US011572617B2

(12) United States Patent
Fenwick et al.

(10) Patent No.: US 11,572,617 B2
(45) Date of Patent: Feb. 7, 2023

(54) PROTECTIVE METAL OXY-FLUORIDE COATINGS

(71) Applicant: Applied Materials, Inc., Santa Clara, CA (US)

(72) Inventors: David Fenwick, Los Altos, CA (US); Chengtsin Lee, Union City, CA (US); Jennifer Y. Sun, Mountain View, CA (US); Yikai Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/498,383

(22) Filed: Apr. 26, 2017

(65) Prior Publication Data
US 2017/0323772 A1    Nov. 9, 2017

Related U.S. Application Data

(60) Provisional application No. 62/331,326, filed on May 3, 2016.

(51) Int. Cl.
*H01J 37/34* (2006.01)
*H01J 37/32* (2006.01)
(Continued)

(52) U.S. Cl.
CPC ...... *C23C 14/0694* (2013.01); *C23C 14/0021* (2013.01); *C23C 14/08* (2013.01);
(Continued)

(58) Field of Classification Search
CPC ............ C23C 14/0021; C23C 14/0694; C23C 14/081; C23C 14/082; C23C 14/083;
(Continued)

(56) References Cited

U.S. PATENT DOCUMENTS 4,936,653 A * 6/1990 Schemmel ........ H01L 31/02161
204/192.11
5,135,775 A * 8/1992 Foller ................... C23C 14/022
427/248.1
(Continued)

FOREIGN PATENT DOCUMENTS

CN    102296263 A    6/2011
CN    104701125      6/2015
(Continued)

OTHER PUBLICATIONS

Machine Translation JP08134637A (Year: 1996).*
(Continued)

*Primary Examiner* — Michael A Band
(74) *Attorney, Agent, or Firm* — Lowenstein Sandler LLP

(57) ABSTRACT

An article comprises a body having a protective coating. The protective coating is a thin film that comprises a metal oxy-fluoride. The metal oxy-fluoride has an empirical formula of $M_xO_yF_z$, where M is a metal, y has a value of 0.1 to 1.9 times a value of x and z has a value of 0.1 to 3.9 times the value of x. The protective coating has a thickness of 1 to 30 microns and a porosity of less than 0.1%.

17 Claims, 5 Drawing Sheets

(51) Int. Cl.
- *C23C 14/06* (2006.01)
- *C23C 14/08* (2006.01)
- *C23C 14/00* (2006.01)
- *C23C 14/46* (2006.01)
- *C23C 16/44* (2006.01)
- *C23C 14/30* (2006.01)

(52) U.S. Cl.
CPC .......... *C23C 14/081* (2013.01); *C23C 14/082* (2013.01); *C23C 14/083* (2013.01); *C23C 14/46* (2013.01); *C23C 16/4404* (2013.01); *H01J 37/32477* (2013.01); *H01J 37/32495* (2013.01); *H01J 37/32559* (2013.01); *H01J 37/3441* (2013.01); *C23C 14/30* (2013.01)

(58) Field of Classification Search
CPC ..... C23C 14/46; C23C 14/30; C23C 14/5806; C23C 16/4404; H01J 37/32495; H01J 37/32477; H01J 37/32559; C03C 2217/73; C03C 2217/732
See application file for complete search history.

(56) References Cited

U.S. PATENT DOCUMENTS

| | | | |
|---|---|---|---|
| 6,783,875 B2 | 8/2004 | Yamada et al. | |
| 6,798,519 B2 | 9/2004 | Nishimoto et al. | |
| 6,806,949 B2 | 10/2004 | Ludviksson et al. | |
| 6,821,616 B1* | 11/2004 | Sakurai | C03C 17/3452 |
| | | | 428/332 |
| 6,916,534 B2 | 7/2005 | Wataya et al. | |
| 7,137,353 B2 | 11/2006 | Saigusa et al. | |
| 7,147,749 B2 | 12/2006 | Nishimoto et al. | |
| 7,163,585 B2 | 1/2007 | Nishimoto et al. | |
| 7,204,912 B2 | 4/2007 | Saigusa et al. | |
| 7,208,044 B2 | 4/2007 | Zurbuchen | |
| 7,291,566 B2 | 11/2007 | Escher et al. | |
| 7,461,614 B2 | 12/2008 | Fink et al. | |
| 7,462,407 B2 | 12/2008 | Maeda et al. | |
| 7,552,521 B2 | 6/2009 | Fink | |
| 7,560,376 B2 | 7/2009 | Escher et al. | |
| 7,678,226 B2 | 3/2010 | Saigusa et al. | |
| 7,696,117 B2 | 4/2010 | Sun et al. | |
| 7,713,640 B2 | 5/2010 | Zurbuchen | |
| 7,732,067 B2 | 6/2010 | Zurbuchen | |
| 7,744,780 B2 | 6/2010 | Kobayashi et al. | |
| 7,780,786 B2 | 8/2010 | Mitsuhashi et al. | |
| 7,811,428 B2 | 10/2010 | Nishimoto et al. | |
| 7,833,924 B2 | 11/2010 | Kobayashi et al. | |
| 7,915,189 B2 | 3/2011 | Kobayashi et al. | |
| 7,998,307 B2 | 8/2011 | Chen et al. | |
| 8,043,971 B2 | 10/2011 | Sasaki et al. | |
| 8,117,986 B2 | 2/2012 | Saigusa et al. | |
| 8,163,403 B2 | 4/2012 | Zurbuchen | |
| 8,372,769 B2 | 2/2013 | Janz et al. | |
| 8,449,715 B2 | 5/2013 | Mitsuhashi et al. | |
| 8,858,745 B2 | 10/2014 | Sun et al. | |
| 8,877,002 B2 | 11/2014 | Mitsuhashi et al. | |
| 8,896,210 B2 | 11/2014 | Nishino et al. | |
| 9,017,765 B2 | 4/2015 | Sun et al. | |
| 2001/0003271 A1 | 6/2001 | Otsuki | |
| 2002/0187405 A1 | 12/2002 | Carcia | |
| 2005/0098106 A1 | 5/2005 | Fink et al. | |
| 2005/0103275 A1 | 5/2005 | Sasaki et al. | |
| 2005/0193951 A1 | 9/2005 | Furuse et al. | |
| 2005/0199183 A1 | 9/2005 | Arai et al. | |
| 2007/0215278 A1 | 9/2007 | Furuse et al. | |
| 2008/0236744 A1 | 10/2008 | Furuse et al. | |
| 2008/0314321 A1 | 12/2008 | Furuse et al. | |
| 2009/0151870 A1 | 6/2009 | Urakawa et al. | |
| 2009/0183835 A1 | 7/2009 | Furuse et al. | |
| 2009/0214825 A1 | 8/2009 | Sun et al. | |
| 2010/0119844 A1 | 5/2010 | Sun et al. | |
| 2010/0129670 A1 | 5/2010 | Sun et al. | |
| 2010/0140222 A1 | 6/2010 | Sun et al. | |
| 2010/0216646 A1 | 8/2010 | Kodenkandath et al. | |
| 2010/0247930 A1 | 9/2010 | Zurbuchen | |
| 2013/0115418 A1 | 5/2013 | Young-Dohe et al. | |
| 2013/0270107 A1* | 10/2013 | Ewert | C23C 14/541 |
| | | | 204/298.09 |
| 2014/0116338 A1* | 5/2014 | He | C23C 14/083 |
| | | | 118/723 E |
| 2014/0118880 A1 | 5/2014 | He et al. | |
| 2014/0120312 A1 | 5/2014 | He et al. | |
| 2014/0147594 A1 | 5/2014 | Jewhurst et al. | |
| 2014/0154510 A1* | 6/2014 | Odagawa | B82Y 10/00 |
| | | | 428/408 |
| 2015/0004418 A1 | 1/2015 | Sun et al. | |
| 2015/0064654 A1 | 3/2015 | Piascik et al. | |
| 2015/0096462 A1 | 4/2015 | Fukagawa et al. | |
| 2015/0126036 A1 | 5/2015 | Zhao | |
| 2015/0143677 A1 | 5/2015 | Sun et al. | |
| 2015/0158775 A1* | 6/2015 | Sun | C23C 14/46 |
| | | | 428/332 |
| 2015/0307982 A1 | 10/2015 | Firouzdor et al. | |
| 2015/0311043 A1 | 10/2015 | Sun et al. | |
| 2015/0321964 A1 | 11/2015 | Sun et al. | |
| 2015/0361540 A1 | 12/2015 | Hamaya et al. | |
| 2016/0254125 A1 | 9/2016 | Huang et al. | |
| 2016/0273095 A1 | 9/2016 | Lin et al. | |
| 2016/0276141 A1 | 9/2016 | Sun et al. | |
| 2016/0307740 A1* | 10/2016 | Kim | H01L 21/6831 |
| 2016/0313473 A1 | 10/2016 | Akiba | |
| 2016/0326058 A1 | 11/2016 | Nagayama et al. | |
| 2017/0029628 A1 | 2/2017 | Takai et al. | |
| 2017/0040146 A1 | 2/2017 | Huang et al. | |
| 2017/0088928 A1 | 3/2017 | Ibe et al. | |
| 2017/0107604 A1 | 4/2017 | Ibe et al. | |
| 2017/0110293 A1 | 4/2017 | Sun et al. | |
| 2017/0114440 A1 | 4/2017 | Takai et al. | |
| 2018/0016193 A1 | 1/2018 | Fukagawa et al. | |

FOREIGN PATENT DOCUMENTS

| | | |
|---|---|---|
| JP | 08134637 A | 5/1996 |
| JP | 2002001865 A | 1/2002 |
| JP | 4283925 | 6/2009 |
| JP | 2013082954 A | 5/2013 |
| JP | 2015110844 | 6/2015 |
| JP | 2016089241 | 5/2016 |
| JP | 2016153369 | 8/2016 |
| JP | 2017061737 | 3/2017 |
| JP | 2017061738 | 3/2017 |
| JP | 2017071843 | 4/2017 |
| WO | 2010016973 A2 | 2/2010 |

OTHER PUBLICATIONS

DERWENT Abstract WO-2011072227-A1 (Year: 2011).*
Mann, A.W.; Bevan, D.J.M. The Crystal Structure of Stoichiometric Yttrium Oxyfluoride, YOF. School of Chemistry, University Western Australia, pp. 2129. (Year: 1970).*
PCT International Search Report for PCT/US2017/030690 dated Jul. 31, 2017, 3 pages.
PCT Written Opinion of The International Searching Authority for PCT/US2017/030690 dated Jul. 31, 2017, 6 pages.
Greve, B.K. et al., "Pronounced Negative Thermal Expansion from a Simple Structure: Cubic $ScF_3$", JACS Communications, published on Web Oct. 19, 2010, 2010 American Chemical Society, J. Am. Chem. Soc. 2010, J. Am. Chem. Soc. Vol. 132, No. 44, 2010, pp. 15496-15498.

* cited by examiner

525
Provide a metal fluoride source material

530
Perform one of sputter deposition or evaporation deposition of the metal fluoride source material

535
Introduce oxygen to the sputtered or evaporated source material during the sputter deposition or the evaporation deposition to form a metal oxy-fluoride coating on an article

FIG. 5B

545
Provide a metal oxide source material

550
Perform one of sputter deposition or evaporation deposition of the metal oxide source material

555
Introduce fluorine to the sputtered or evaporated source material during the sputter deposition or the evaporation deposition to form a metal oxy-fluoride coating on an article

FIG. 5C

PROTECTIVE METAL OXY-FLUORIDE COATINGS

RELATED APPLICATIONS

This patent application claims the benefit under 35 U.S.C. § 119(e) of U.S. Provisional Application No. 62/331,326, filed May 3, 2016.

TECHNICAL FIELD

Embodiments of the present disclosure relate, in general, to a protective metal oxy-fluoride coating that may be used on semiconductor process chamber components, and to methods for making a protective metal oxy-fluoride coating that may be used on semiconductor process chamber components.

BACKGROUND

Semiconductor wafer manufacturing processes are performed in chambers where chamber components are exposed to high temperatures, high energy plasma, a mixture of corrosive gases, high stress, and combinations thereof. Chamber components can be shielded from these extreme conditions by protective coatings. Metal oxides are frequently used to coat chamber components due to their resistance to erosion from plasma etch chemistries. Metal oxide coatings transform into metal fluorides during processing of wafers from exposure to fluorine-based chemistries. The transformation of metal oxide into metal fluoride is usually accompanied by a volume expansion, increasing stress on the coating. For example, the transformation of one mole of $Y_2O_3$ (yttria) to two moles of $YF_3$ (yttrium fluoride) has a theoretical volume expansion of about 60%. The volume expansion and added stress caused by conversion of a metal oxide into a metal fluoride can cause the chamber components to blister and/or shed particles, resulting in defects to processed wafers.

SUMMARY

A thin film is described below. The thin film includes a metal oxy-fluoride (MOF) having an empirical formula of $M_xO_yF_z$. M represents a metallic element; y has a value of 0.1 to 1.9 times a value of x, and z has a value of 0.1 to 3.9 times the value of x. This MOF thin film has a thickness of 1 to 30 microns and a porosity of less than 0.1%. An example implementation of the MOF thin film includes a protective coating on a surface of a chamber component for semiconductor processing equipment.

Several methods are also described below. One method includes providing a MOF source material having an empirical formula of $M_xO_{y\_source}F_{z\_source}$. Y_source has a value of 0.1 to 1.9 times a value of x, and z_source has a value of 0.1 to 3.9 times the value of x. The MOF source material is deposited on an article by sputter deposition or evaporation to form a MOF coating on the article. For example, the article may include semiconductor process chamber components. Similar to the MOF source material, the MOF coating on the article has an empirical formula of $M_xO_{y\_coating}F_{z\_coating}$. Y_coating has a value of 0.1 to 1.9 times a value of x, and z_coating has a value of 0.1 to 3.9 times the value of x. Features of the MOF coating include a thickness of 1 to 30 microns and a porosity of less than 0.1%.

A second method includes providing a source material and depositing the source material on an article by sputter deposition or evaporation deposition. The article may include one or more semiconductor process chamber components. In one example of this second method, the source material is a metal. Oxygen and fluorine ions or radicals are introduced to the sputtered or evaporated metal during deposition, and a MOF coating is formed on the article. In another example of this second method, the source material is a metal oxide (MO), and fluorine ions or radicals are introduced to the sputtered or evaporated metal oxide during deposition, forming a MOF coating on the article. In a third example of this second method, the source material is a metal fluoride (MF), and oxygen ions or radicals are introduced to the sputtered or evaporated MF during deposition to form a MOF coating on the article. The MOF coating has an empirical formula of $M_xO_{y\_coating}F_{z\_coating}$. Y_coating has a value of 0.1 to 1.9 times a value of x, and z_coating has a value of 0.1 to 3.9 times the value of x. The MOF coating has a thickness of 1 to 30 microns and a porosity of less than 0.1%.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 5A-5C illustrate example methods of forming metal oxy-fluoride coatings on articles according to various embodiments of the present invention.

DETAILED DESCRIPTION OF FEATURES AND EXAMPLES

Figure 1:
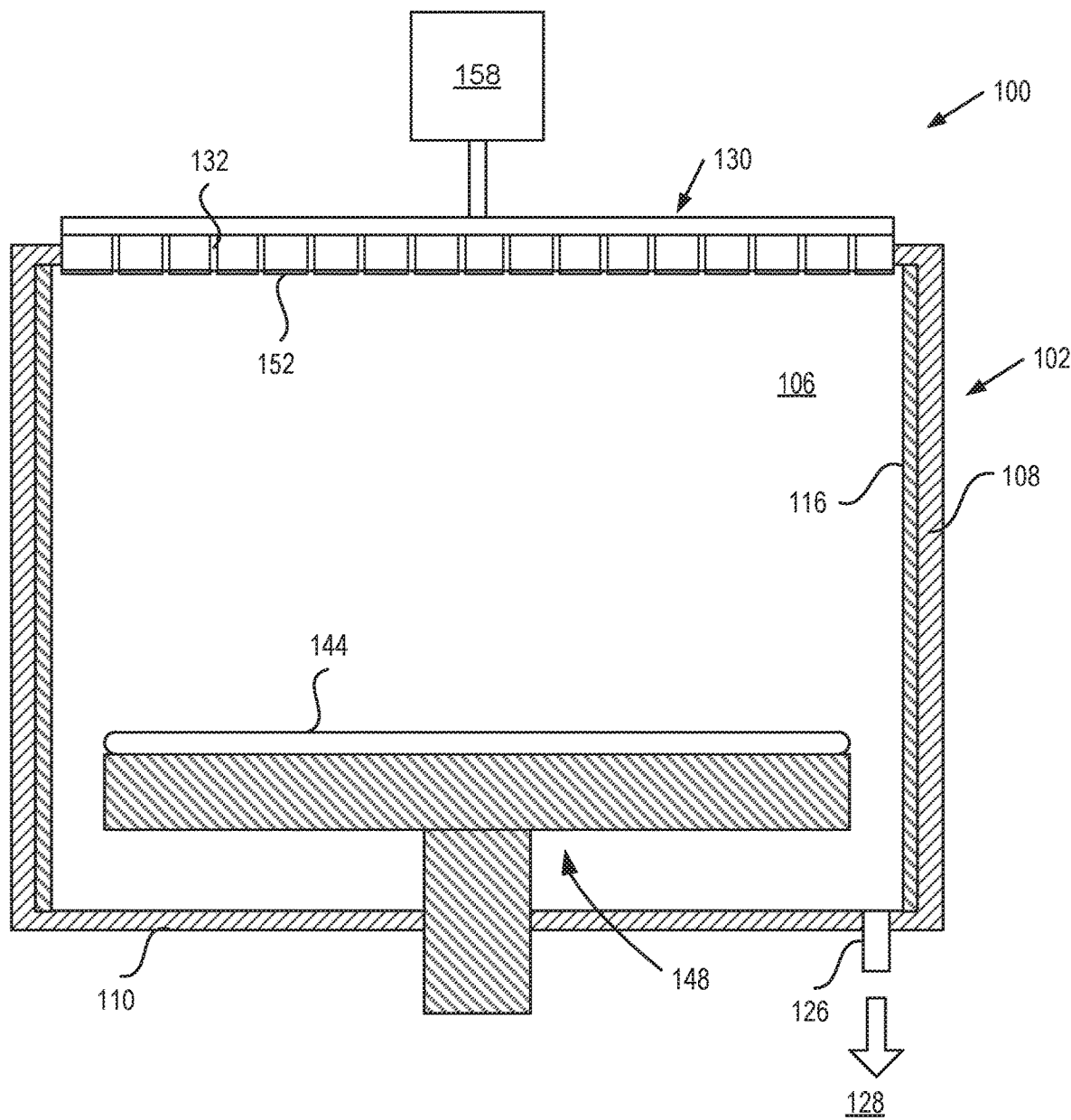
FIG. 1 illustrates an example architecture of a semiconductor manufacturing system, in accordance with one embodiment of the present invention.

As described above, metal oxide protective layers that may be used on articles to protect those articles from exposure to plasmas. Metal oxide coatings transform into metal fluorides when exposed to fluorine-based chemistries, and the transformation is accompanied by a volume expansion and particle defects on processed wafers. Fluorine based chemistries are often used to perform plasma etching of substrates.

Described herein are embodiments of metal oxy-fluoride (MOF) protective coatings that are resistant to reaction with fluorine chemistries. MOF coatings described in embodiments herein significantly decrease fluoridation of the coating relative to MO coatings. Additionally, MOF coatings may have coefficients of thermal expansion that match the coefficients of thermal expansion of chamber components much more closely relative to MF coatings. These features may improve the erosion resistance of the coating for articles in semiconductor manufacturing environments and reduce particle defects attributed to the protective coatings.

Thin film MOF compositions having these features are described below, along with several methods for forming MOF coatings.

Example embodiments of a thin film include a MOF having an empirical formula of $M_xO_yF_z$, where M is a metal generally having a positive valence configuration, O is oxygen, and F is fluorine. The subscripts represent the number of each respective atom relative to the others. For example, a value of y is 0.1 to 1.9 times a value of x, and a value of z is 0.1 to 3.9 times the value of x. In any case, the value of all the subscripts combined with the valence number of each respective atom may be balanced such that the thin film is electronically neutral. Additionally, embodiments of the thin film have a thickness of 1 to 30 microns and a porosity of less than 0.1%.

Several methods are available for manufacturing a thin film coating with the benefits described above. For example, one method includes providing a MOF source material with the same empirical formula as the target coating. The source material is then deposited onto an article by sputter deposition or evaporation deposition. In another method, the source material is a metal. The metal is sputtered or evaporated onto an article in the presence of oxygen and fluorine ions or radicals, such as those formed by a plasma or emitted from an ion gun. In either case, the ions or radicals bombard the sputtered source material as it is deposited on the article, combining with the metal to form a MOF coating on the article.

One method includes providing a MF source material. The source material is sputtered or evaporated onto an article, and the source material is bombarded with oxygen ions or radicals as it accumulates on the article. As a result, a MOF coating is formed on the article. Alternatively, another method includes providing a MO source material and sputtering or evaporating the source material onto an article. The source material is bombarded with fluorine ions or radicals as it accumulates on the article, forming a MOF coating.

A benefit of depositing the coating by sputter or evaporation deposition is the ability to achieve a porosity of less than 0.1%. It is recognized that other deposition methods which accomplish this benefit are considered equivalents of the sputter or evaporation deposition.

The term "plasma resistant material" refers to a material that is resistant to erosion and corrosion due to exposure to plasma processing conditions. The plasma processing conditions include a plasma generated from halogen-containing gases, such as $C_2F_6$, $SF_6$, $SiCl_4$, HBR, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. The resistance of the material to plasma is measured through "etch rate" (ER), which may have units of Angstrom/min (Å/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a plasma resistant coating material. A single plasma resistant material may have multiple different plasma resistance or erosion rate values. For example, a plasma resistant material may have a first plasma resistance or erosion rate associated with a first type of plasma and a second plasma resistance or erosion rate associated with a second type of plasma.

When the terms "about" and "approximately" are used herein, these are intended to mean that the nominal value presented is precise within ±10%. Some embodiments are described herein with reference to chamber components and other articles installed in plasma etchers for semiconductor manufacturing. It should be understood that such plasma etchers may also be used to manufacture micro-electro-mechanical systems (MEMS)) devices. Additionally, the articles described herein may be other structures that are exposed to plasma. Articles discussed herein may be chamber components for processing chambers such as semiconductor processing chambers. For example, the articles may be chamber components for a plasma etcher, a plasma cleaner, a plasma propulsion system, or other processing chambers. The processing chambers may be used for processes in which a corrosive plasma environment having plasma processing conditions is provided. For example, the processing chamber may be a chamber for a plasma etcher or plasma etch reactor, a plasma cleaner, and so forth. Examples of chamber components include a substrate support assembly, an electrostatic chuck (ESC), a ring (e.g., a process kit ring or single ring), a chamber wall, a base, a gas distribution plate, a showerhead, a nozzle, a lid, a liner, a liner kit, a shield, a plasma screen, a flow equalizer, a cooling base, a chamber viewport, a chamber lid, and so on.

Moreover, embodiments are described herein with reference to ceramic articles that cause reduced particle contamination when used in a process chamber for plasma rich processes. It should be understood that the ceramic articles discussed herein may also provide reduced particle contamination when used in process chambers for other processes such as non-plasma etchers, non-plasma cleaners, chemical vapor deposition (CVD) chambers, physical vapor deposition (PVD) chambers, plasma enhanced chemical vapor deposition (PECVD) chambers, plasma enhanced physical vapor deposition (PEPVD) chambers, plasma enhanced atomic layer deposition (PEALD) chambers, and so forth.

FIG. 1 is a sectional view of a semiconductor processing chamber 100 having one or more chamber components that are coated with a MOF thin film protective layer in accordance with embodiments of the present invention. The processing chamber 100 may be used for processes in which a fluorine-based corrosive plasma environment is provided. For example, the processing chamber 100 may be a chamber for a plasma etcher or plasma etch reactor, a plasma cleaner, and so forth that uses a Fluorine-based chemistry for etching and/or cleaning. Examples of chamber components that may include a MOF thin film protective layer include a substrate support assembly 148, an electrostatic chuck (ESC), a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid, a face plate, an selectivity modulation device (SMD), and so on. The MOF thin film protective layer, which is described in greater detail below, may include yttrium oxy-fluoride or other metal oxy-fluorides.

In one embodiment, the processing chamber 100 includes a chamber body 102 and a showerhead 130 that enclose an interior volume 106. Alternatively, the showerhead 130 may be replaced by a lid and a nozzle in some embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include a MOF thin film protective layer.

An outer liner 116 may be disposed adjacent the sidewalls 108 to protect the chamber body 102. The outer liner 116 may be fabricated and/or coated with a MOF thin film protective layer. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 and/or top of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 is used for processing chambers used for dielectric etch (etching of dielectric materials). The showerhead 130 may include a gas distribution plate (GDP) having multiple gas delivery holes 132 throughout the GDP 133. The showerhead 130 may include the GDP bonded to a showerhead base, which may be an aluminum base or an anodized aluminum base. The GDP may be made from Si or SiC, or may be a ceramic such as $Y_2O_3$, $Al_2O_3$, $Y_3Al_5O_{12}$ (YAG), and so forth. As shown, the showerhead 130 includes a MOF coating 152 on a surface of the showerhead 130.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead 130 and/or nozzle may be coated with a MOF thin film protective layer.

Examples of Fluorine based processing gases that may be used to process substrates in the processing chamber 100 include halogen-containing gases, such as $C_2F_6$, $SF_6$, $NF_3$, $CF_4$, $CHF_3$, $CH_2F_3$, F, $NF_3$, and $SiF_4$, among others. Examples of carrier gases that may also be used include $N_2$, He, Ar, and other gases inert to process gases (e.g., non-reactive gases).

In some embodiments, the processing chamber 100 may include a face plate and/or a selectivity modulation device (SMD) that may be positioned above the showerhead. The face plate and SMD are components used for providing remote plasma to the processing chamber 100. The face plate and SMD may be made out of Aluminum (e.g., Aluminum 6061) or another metal. In some instances, the face plate and SMD have a plasma sprayed protective coating such as a coating of $Y_2O_3$ for erosion protection. Additionally or alternatively, the face plate and SMD may have a MOF thin film coating for erosion protection. These components may be used, for example, if the processing chamber is a remote plasma chamber (e.g., a selective removal products (SRP) chamber). In operation, there is a low intensity plasma between the face plate and SMD, and a radical will go through them to the wafer for selective etching. The SMD modulates selectivity of the plasma.

The substrate support assembly 148 is disposed in the interior volume 106 of the processing chamber 100 below the showerhead 130 or lid. The substrate support assembly 148 includes a ceramic electrostatic chuck that holds the substrate 144 during processing and a cooling base coupled to the electrostatic chuck. An inner liner (not shown) may be coated on the periphery of the substrate support assembly 148. The inner liner may be a halogen-containing gas resistant material such as those discussed with reference to the outer liner 116. In one embodiment, the inner liner may be fabricated from the same materials of the outer liner 116. Additionally, the inner liner may be coated with a MOF thin film protective layer.

Figure 2:
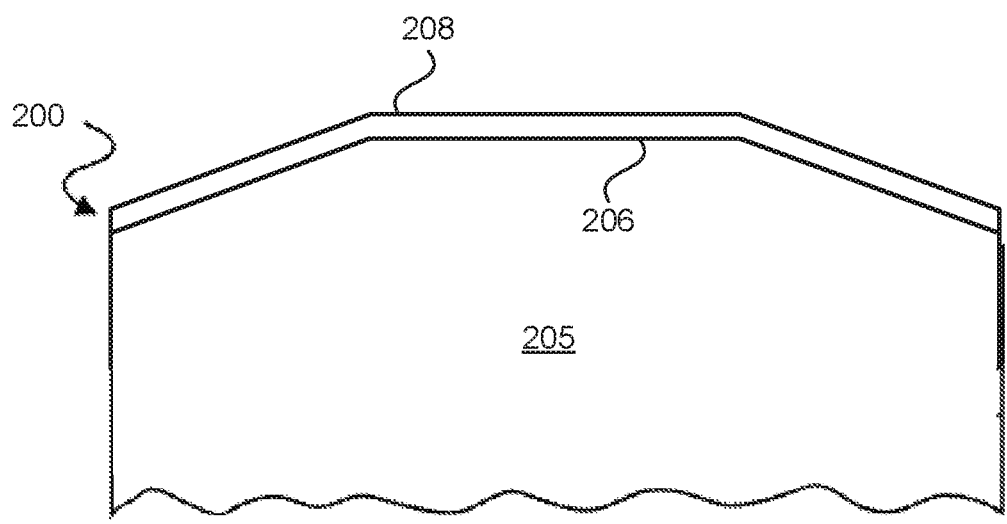
FIG. 2 depicts a section view of an example article with a thin film protective coating according to various embodiments.

FIG. 2 illustrates a cross sectional side view of an article (e.g., chamber components) covered by a MOF thin film protective layer that is plasma resistant. At least a portion of a base or body 205 of an article 200 is coated by a MOF thin film protective layer 208. The article 200 may be a chamber component, such as a substrate support assembly, an electrostatic chuck (ESC), a ring (e.g., a process kit ring or single ring), a chamber wall, a base, a gas distribution plate or showerhead, a liner, a liner kit, a shield, a plasma screen, a flow equalizer, a cooling base, a chamber viewport, a chamber lid, a face plate, an SMD, and so on. The body 205 of the article 200 may be a metal, a ceramic, a metal-ceramic composite, a polymer, or a polymer-ceramic composite. In one embodiment, the body 205 of the article 200 is an aluminum alloy (e.g., 6061 aluminum) or stainless steel. In another embodiment, the body 205 of the article 200 is a ceramic material such as $Al_2O_3$, $Y_2O_3$, AlN, $SiO_2$, and so on. In another embodiment, the body 205 of the article 200 is a polymer based material such as Kapton®, Teflon®, and so forth.

Various chamber components are composed of different materials. For example, an electrostatic chuck may be composed of a ceramic such as $Al_2O_3$ (alumina), AlN (aluminum nitride), TiO (titanium oxide), TiN (titanium nitride) or SiC (silicon carbide) bonded to an anodized aluminum base. $Al_2O_3$, AlN and anodized aluminum have poor plasma erosion resistance. When exposed to a plasma environment with a Fluorine chemistry, an electrostatic puck of an electrostatic chuck may exhibit degraded wafer chucking, increased He leakage rate, wafer front-side and back-side particle production and on-wafer metal contamination after about 50 radio frequency hours (RFHrs) of processing. A radio frequency hour is an hour of processing.

A lid for a plasma etcher used for conductor etch processes may be a sintered ceramic such as $Al_2O_3$ since $Al_2O_3$ has a high flexural strength and high thermal conductivity. $Al_2O_3$ exposed to Fluorine chemistries forms AlF particles as well as aluminum metal contamination on wafers.

The showerhead for an etcher used to perform dielectric etch processes is typically made of anodized aluminum bonded to a SiC faceplate. When such a showerhead is exposed to plasma chemistries including Fluorine, AlF may form due to plasma interaction with the anodized aluminum base. Additionally, a high erosion rate of the anodized aluminum base may lead to arcing and ultimately reduce a mean time between cleaning for the showerhead.

Some chamber lids and other chamber components have a thick film protective layer on a plasma facing side to minimize particle generation and metal contamination and to prolong the life of the lid. Plasma spraying and other thermal spraying techniques may be used to form the thick film protective layer. Most thick film coating techniques have a long lead time. Additionally, for most thick film coating techniques special surface preparation is performed to prepare the article to be coated (e.g., the lid) to receive the coating. Such long lead times and coating preparation steps can increase cost and reduce productivity, as well as inhibit refurbishment. Additionally, most thick-film coatings have inherent cracks and pores that might degrade on-wafer defect performance.

One disadvantage of many thick film oxide coatings such as a plasma sprayed $Y_2O_3$ is that these coatings will react with Fluorine based chemistries. For example, a $Y_2O_3$ (yttrium oxide) plasma sprayed protective coating may be used to protect a chamber component from erosion caused by Fluorine based chemistries. The Fluorine will react with the yttrium oxide to form yttrium fluoride at the surface of the plasma sprayed protective coating. In other words, the plasma sprayed protective coating will absorb some percentage of the Fluorine. The absorption of the Fluorine into the plasma sprayed protective coating reduces an amount of Fluorine that is available for an etch reaction. This may reduce an etch rate of an etch process. The fluorine may also later be sputtered from the protective coating, which can increase an amount of fluorine that is available for future etch processes. Accordingly, the stability of the etch rate for etch processes using Fluorine chemistries may be reduced.

Additionally, the fluoridation of the oxide coating (e.g., the conversion of yttria to yttrium fluoride) is accompanied by a volume expansion. The volume expansion causes stress at the surface of the coating, and may additionally cause blistering at the surface. The stress and/or blistering causes particles to shed from the coating and causes particle contamination on processed wafers.

The examples provided above set forth just a few chamber components whose performance may be improved by use of a MOF thin film protective layer as set forth in embodiments herein.

Referring back to FIG. 2, the body 205 of the article 200 may include one or more surface features, such as the mesa 206. For an electrostatic chuck, surface features may include mesas, sealing bands, gas channels, helium holes, and so forth. For a showerhead, surface features may include a bond line, hundreds or thousands of holes for gas distribution, divots or bumps around gas distribution holes, and so forth. Other chamber components may have other surface features.

The MOF thin film protective layer 208 formed on the body 205 may conform to the surface features of the body 205. As shown, the MOF thin film protective layer 208 maintains a relative shape of the upper surface of the body 205 (e.g., telegraphing the shapes of the mesa). Additionally, the MOF thin film protective layer 208 may be thin enough so as not to plug holes in a showerhead or He holes in an electrostatic chuck. In one embodiment, the MOF thin film protective layer 208 has a thickness of below about 200 microns. In a further embodiment, the MOF thin film protective layer 208 has a thickness of below 50 microns. In one embodiment, the MOF thin film protective layer 208 has a thickness of 1-30 microns. In one embodiment, the MOF thin film protective layer 208 has a thickness of 1-15 microns.

The MOF thin film protective layer 208 is a deposited ceramic layer that may be formed on the body 205 of the article 200 using an ion assisted deposition (IAD) process or a physical vapor deposition (PVD) process. For example, the MOF thin film protective layer 208 may be deposited by sputter deposition or evaporation deposition. Additionally, ions or radicals may be implanted during sputter or evaporation deposition by an ion gun or by a plasma. The IAD- or PVD-deposited MOF thin film protective layer 208 may have a relatively low film stress (e.g., as compared to a film stress caused by plasma spraying). The IAD- or PVD-deposited MOF thin film protective layer 208 may additionally have a porosity that is less than 1%, and less than about 0.1% in some embodiments. The IAD- or PVD-deposited MOF thin film protective layer 208 is a dense structure, which can have performance benefits for application on a chamber component. Additionally, the MOF thin film protective layer 208 may be crack-free upon deposition and after continued use.

The IAD- or PVD-deposited MOF thin film protective layer 208 may be deposited without first roughening the upper surface of the body 205 or performing other time consuming surface preparation steps. Since roughening the body may reduce a breakdown voltage of the body 205, the ability to apply the MOF thin film protective layer 208 without first roughening the body 205 may be beneficial for some applications (e.g., for an electrostatic chuck). Moreover, the MOF thin film protective layer 208 is very smooth and reduces both particle defects and metal contamination for processed wafers.

The MOF thin film protective layer 208 is resistant to reaction with fluorine based chemistries. Accordingly, the fluorine concentration in fluorine-based plasmas may remain nearly constant during etch and clean processes. As a result, the etch rate also remains steady during the etch and clean processes.

The MOF thin film protective layer 208 includes one or more metals, oxygen, and fluorine. In general, the metal is one for which there is a volume increase for a metal fluoride relative to a corresponding MO. In other words, a metal is suitable for use in the MOF thin film protective layer 208 if the volume of the MOF is greater than the volume of the MO. Suitable metals include yttrium, gadolinium, aluminum, cerium, dysprosium, zirconium, calcium, magnesium, erbium, lanthanum, neodymium, ytterbium and strontium. Table 1 below shows the volume increase of the MF compared to the MO for a few suitable metals.

TABLE 1

Volume expansion of MF compared to MO

| Metal | Volume ratio Fluoride/Oxide |
| --- | --- |
| Calcium | 1.46 |
| Magnesium | 1.76 |
| Strontium | 1.34 |
| Aluminum | 2.06 |
| Erbium | 1.30 |
| Lanthanum | 1.32 |
| Yttrium | 1.61 |
| Neodymium | 1.30 |
| Cerium | 1.88 |
| Zirconium | 1.74 |
| Gadolinium | 1.19 |
| Ytterbium | 1.31 |

The MOF thin film protective layer 208 may include one or more suitable metals. Thus, the MOF thin film protective layer 208 may include one or more MOFs. For example, in one embodiment, the MOF thin film protective layer 208 is yttrium oxy-fluoride. In another embodiment, the MOF thin film protective layer 208 is a combination of yttrium oxy-fluoride and zirconium oxy-fluoride. In such an embodiment, the metal of the MOF thin film protective layer 208 may include approximately 20-30% zirconium.

The MOF thin film protective layer 208 has an empirical formula $M_xO_yF_z$, where the empirical formula represents one molecular unit of the MOF thin film protective layer 208. The subscripts represent relative amounts of each constituent metal, oxygen or fluorine atom. Thus, x represents the number of metal atoms per molecular unit of the MOF thin film protective layer 208, y represents the number of oxygen atoms per molecular unit of the MOF thin film protective layer 208, and z represents the number of fluorine atoms per molecular unit of the MOF thin film protective layer 208.

The empirical formula depends on the valence number of the metal, or the number of electrons the metal can accept from the oxygen and fluorine atoms. Each oxygen molecule will typically contribute two electrons, and each fluorine atom will typically contribute one electron. Depending on the type, the metal can accept up to four electrons. Thus, depending on the metal, a value of y (i.e. the number of oxygen atoms) can range between 0.1 and 1.9 times a value of x. Similarly, a value of z (i.e. the number of fluorine atoms) can range between 0.1 and 3.9 times the value of x. One embodiment of the MOF thin film protective layer 208 is yttrium oxy-fluoride, which has an empirical formula of YOF (note: subscripts are omitted when the value is 1). Another embodiment of the MOF thin film protective layer 208 is yttrium oxy-fluoride with a low fluoride concentration. Such a MOF thin film may have an empirical formula of, for example, $YO_{1.4}F_{0.2}$. In such a configuration, there are, on average, 1.4 oxygen atoms per yttrium atom, and 0.2 fluorine atoms per yttrium atom. Conversely, one embodiment of the MOF thin film protective layer 208 is yttrium oxy-fluoride with a high fluoride concentration. Such a MOF thin film may have an empirical formula of, for example, $YO_{0.1}F_{2.8}$. In such a configuration, there are, on average, 0.1 oxygen atoms per yttrium atom, and 2.8 fluorine atoms per yttrium atom.

The proportion of metal to oxygen and fluorine in the MOF thin film can also be expressed in terms of atomic percent. For example, for a metal having a valance of +3, a minimum oxygen content of 10 atomic percent corresponds with a maximum fluorine concentration of 63 atomic percent. Conversely, for the same metal having a valance of +3, a minimum fluorine content of 10 atomic percent corresponds with a maximum oxygen concentration of 52 atomic percent. Accordingly, for a metal having a valence of +3 the MOF thin film may have approximately 27-38 at. % of the metal (or metals), 10-52 atomic % (at. %) oxygen and approximately 10-63 at. % fluorine. In one embodiment, the MOF thin film has 32-34 at. % of the metal (or metals), 30-36 at. % oxygen, and 30-38 at. % fluorine.

For a metal having a valence of +2, the MOF thin film may have approximately 37-48 at. % of the metal, 10-43 at. % oxygen and approximately 10-53 at. % fluorine. In one embodiment, the MOF thin film has 40-45 at. % of the metal (or metals), 20-35 at. % oxygen, and 20-40 at. % fluorine.

For a metal having a valence of +4, the MOF thin film may have approximately 22-32 at % of the metal, approximately 10-58 at. % oxygen and approximately 10-68 at. % fluorine. In one embodiment, the MOF thin film has 26-28 at. % of the metal (or metals), 30-42 at. % oxygen, and 30-44 at. % fluorine.

Reflectivity of the MOF thin film protective layer 208 ranges from transparent in certain embodiments to opaque in other embodiments. The MOF thin film protective layer 208 has an effective operating temperature range from approximately 15 Celsius to 500 Celsius. The breakdown voltage of a 10 micron MOF thin film protective layer is approximately 500 Volts in embodiments. The MOF thin film protective layer 208 also benefits from a high hardness compared to the corresponding MF. For example, $YF_3$ has a Vickers hardness ranging from 2.74 to 3.15 giga pascals (GPa). YOF has a hardness of greater than 3.15 GPa.

MOs such as yttria (yttrium oxide) can be crystalline in structure, whereas corresponding MFs, i.e. yttrium fluoride, can be amorphous. Depending on the method and temperature used in deposition, the MOF thin film protective layer 208 can, in some embodiments, be amorphous, and in other embodiments, be at least partially crystalline. Despite the variety of lattice structures available in different embodiments, the morphology of the MOF thin film protective layer 208 is generally uniform.

Figure 3A:
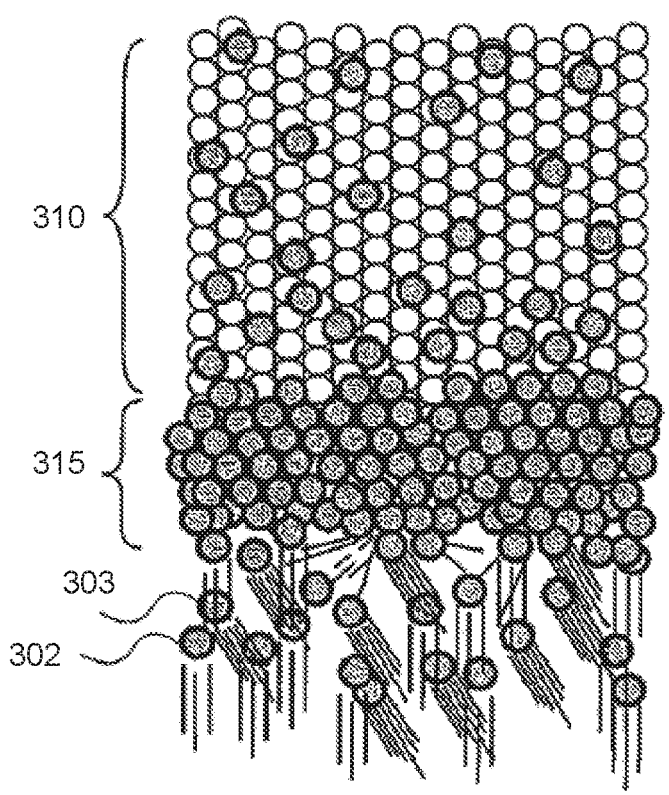
FIGS. 3A-3B illustrate example deposition techniques according to various embodiments of the present invention.
Figure 3B:
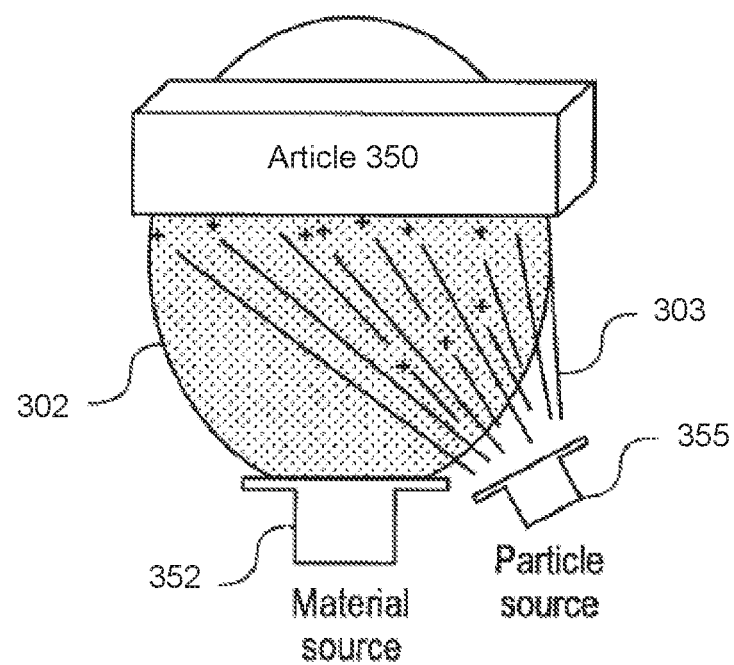

FIGS. 3A and 3B generally depict deposition mechanisms applicable to a variety of deposition techniques such as IAD or PVD. Exemplary IAD methods include deposition processes which incorporate ion bombardment, such as evaporation (e.g., activated reactive evaporation (ARE) or electron beam ion assisted deposition (EB-IAD)) and sputtering (e.g., ion beam sputtering ion assisted deposition (IBS-IAD)) in the presence of ion bombardment to form plasma resistant coatings as described herein. EB-IAD may be performed by evaporation. IBS-IAD may be performed by sputtering a solid target material (e.g., a solid metal target). Any of the IAD methods may be performed in the presence of a reactive gas species, such as $O_2$, $N_2$, halogens, etc. Alternatively, PVD can be performed without ion assistance.

As shown, a MOF thin film protective layer 315 is formed by an accumulation of deposition materials 302 in the presence of energetic particles 303 such as ions or radicals. The deposition materials 302 include atoms, ions, radicals, or their mixture. For example, the deposition materials 302, in some embodiments, include atoms and molecules sputtered or evaporated. The energetic particles 303 may impinge and compact the MOF thin film protective layer 315 as it is formed. Additionally, the energetic particles 303 may interact with the deposition materials to form the MOF thin film protective layer 315.

FIG. 3B depicts a schematic of an IAD deposition apparatus. As shown, a material source 352 provides a flux of deposition materials 302 while an energetic particle source 355 provides a flux of the energetic particles 303, both of which impinge upon the article 350 throughout the IAD process. The energetic particle source 355 may be an Oxygen, Fluorine, and/or other material source such as argon. Additionally, multiple different energetic particle sources may be used. For example, an Oxygen energetic particle source and a Fluorine energetic particle source may be used. The material source (e.g., a target body) 352 used to provide the deposition materials 302 may be a bulk sintered ceramic corresponding to the same ceramic that the thin film protective layer 315 is to be composed of. For example, the material source 352 may be a bulk sintered YOF. In some embodiments, the materials source 352 may provide a portion of the materials for the MOF thin film protective layer 315. For example, the material source 352 may consist solely of the metal for the MOF thin film protective layer 315. If the MOF thin film protective layer 315 will include multiple metals (e.g., yttrium and zirconium), then the material source 352 may be a metal alloy. Alternatively, two different metal material sources may be used. In such embodiments, the particle source 355 provides the oxygen and fluorine atoms for the MOF thin film protective layer 315. As another example, the material source 352 may consist of a MF, such as bulk sintered $YF_3$. In such embodiments, the particle source 355 provides the oxygen atoms for the MOF thin film protective layer 315. If the MOF thin film protective layer 315 is to include multiple metals, then the MF material source 352 may be a fluoride that includes both metals. Alternatively, two different MF material sources may be used. As yet another example, the material source 352 may consist of a MO, such as $Y_2O_3$. In such embodiments, the particle source 355 provides the fluorine atoms for the MOF thin film protective layer 315. If the MOF thin film protective layer 315 is to include multiple metals, then the MO material source 352 may be an oxide that includes both metals. Alternatively, two different MO material sources may be used.

IAD may utilize one or more plasmas or beams to provide the material and energetic ion sources. Reactive species may also be provided during deposition of the plasma resistant coating. In one embodiment, the energetic particles 303 include at least one of non-reactive species (e.g., Ar) or reactive species (e.g., O, F). In further embodiments, reactive species such as CO and halogens (Cl, F, Br, etc.) may also be introduced during the formation of a plasma resistant coating to further increase the tendency to selectively remove deposited material most weakly bonded to the thin film protective layer 315.

With IAD processes, the energetic particles 303 may be controlled by the energetic ion (or other particle) source 355 independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition.

The ion assist energy is used to densify the coating and to accelerate the deposition of the material on the surface of the substrate. Ion assist energy can be varied using both the voltage and current of the ion source. The voltage and current can be adjusted to achieve high and low coating density, to manipulate a stress of the coating and also a crystallinity of the coating. The ion assist energy may range from approximately 50-800 V and approximately 1-50 amps (A). The ion assist energy can also be used to intentionally change a stoichiometry of the coating. For example, a metallic target can be used during deposition, and converted to a metal oxy-fluoride.

Coating temperature can be controlled by using heaters to heat a deposition chamber and/or an article and by adjusting a deposition rate. Article temperature during deposition may be roughly divided into low temperature (around 70-150° C. in one embodiment) and high temperature (greater than 150° C. in one embodiment). Deposition temperature can be used to adjust film stress, crystallinity, and other coating properties.

A working distance is a distance between the electron beam (or ion beam) gun and the article. The working distance can be varied to achieve a coating with a highest uniformity. Additionally, working distance may affect deposition rate and density of the coating.

A deposition angle is the angle between the electron beam (or ion beam) and the article. Deposition angle can be varied by changing the location and/or orientation of the substrate. By optimizing the deposition angle, a uniform coating in three dimensional geometries can be achieved.

EB-IAD and IBS-IAD depositions are feasible on a wide range of surface conditions. Polished surfaces may be superior to achieve a uniform coating coverage. Various fixtures may be used to hold the substrate during the IAD deposition.

Figure 4:
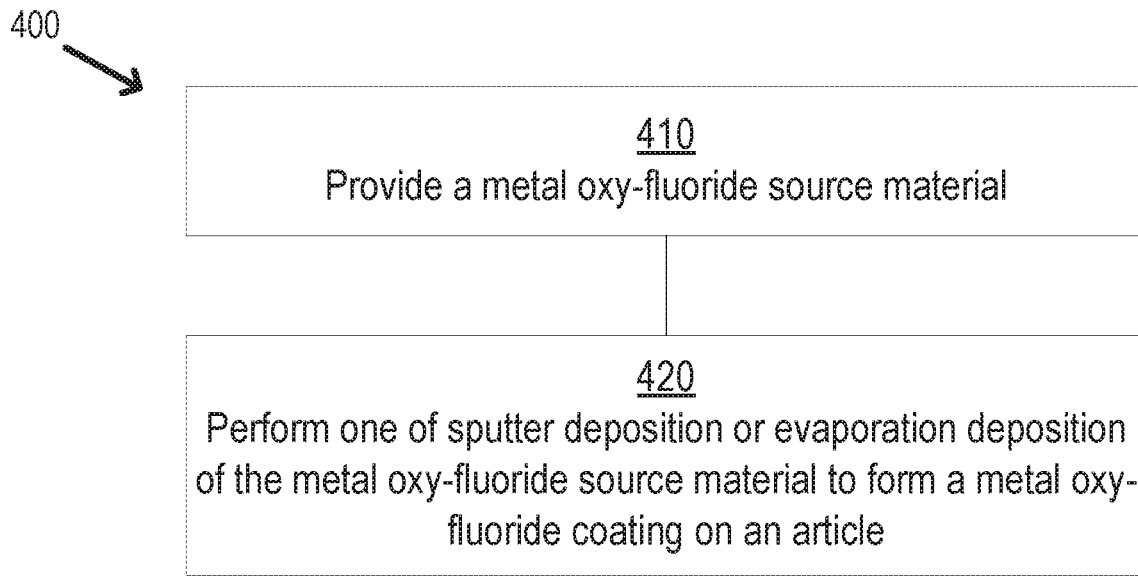
FIG. 4 illustrates an example method of forming a metal oxy-fluoride coating on an article, in accordance with one embodiment of the present invention.

FIG. 4 depicts one example embodiment of a method 400 for forming a MOF thin film protective coating. At block 410, a MOF source material is provided. The MOF source material has an empirical formula of $M_xO_{y\_source}F_{z\_source}$.

$Y\_source$ has a value of 0.1 to 1.9 times a value of x and $z\_source$ has a value of 0.1 to 3.9 times the value of x. For example, in one embodiment, the source material is YOF. In other embodiments, other MOF source materials are used. In each embodiment, the MOF exhibits a volume increase relative to the corresponding MO. In other words, a metal is suitable for use in the MOF thin film protective layer 208 if the volume of the MOF is greater than the volume of the MO. Suitable metals include yttrium, gadolinium, aluminum, cerium, dysprosium, zirconium, calcium, magnesium, erbium, lanthanum, neodymium, ytterbium, and strontium.

At block 420, the MOF source material is deposited by sputter or evaporation deposition to form a MOF coating on an article. The MOF coating has an empirical formula of $M_xO_{y\_coating}F_{z\_coating}$, where y_coating has a value of 0.1 to 1.9 times a value of x and z_coating has a value of 0.1 to 3.9 times the value of x. In some embodiments, $M_xO_{y\_source}F_{z\_source}$ and $M_xO_{y\_coating}F_{z\_coating}$ are the same, such that y_source equals y_coating and z_source equals z_coating. In other embodiments, $M_xO_{y\_coating}F_{z\_coating}$ can be adjusted relative to $M_xO_{y\_source}F_{z\_source}$ by introducing one or more of oxygen or fluoride ions or radicals during the deposition at block 420.

The deposition may be done using the apparatus depicted in FIG. 3B. The article may be any of the semiconductor process chamber components discussed with regard to FIG. 1. For example, the article may be any component of the Applied Centris™ Sym3™ Etch system manufactured by Applied Materials, or the Applied Producer® Etch system also manufactured by Applied Materials. More generally, the article may be any article exposed to a high energy plasma or a reactive gas environment that may cause erosion and decreased functionality of the article.

The deposition at block 420 may further comprise heating the article to 15 to 150 degrees Celsius. In some embodiments, the article is heated before deposition, the MOF coating is formed on the article, then the article and MOF coating are cooled. Additionally, in some embodiments, the deposition at block 420 is performed in a vacuum chamber. The pressure inside the vacuum chamber may initially be pumped down to a fraction of a mTorr, such as to 0.1 mTorr. As gases for the deposition are introduced to the chamber, the chamber pressure is maintained from 0.1 to 100 mTorr. The resultant MOF thin film protective coating has a thickness from 1 to 30 microns and a porosity of less than 0.1% in some embodiments. In some embodiments, the MOF thin film protective coating has a thickness less than 20 microns. In other embodiments, the MOF thin film protective coating has a thickness of approximately 10 microns.

In a specific embodiment of method 400, a bulk sintered YOF source material and a semiconductor process chamber component is provided at block 410 in a vacuum chamber. At block 420, the vacuum chamber is sealed and the pressure inside the vacuum chamber is reduced to approximately 0.1 mTorr. The semiconductor process chamber component is heated to approximately 150 degrees Celsius. At block 420, the YOF source material is evaporated onto the semiconductor process chamber component, forming a thin film protective layer. Alternatively, the YOF source material may be sputtered onto the semiconductor process chamber component. Once a target thickness of the thin film is reached, the semiconductor process chamber component and YOF thin film protective layer are cooled.

Figure 5A:
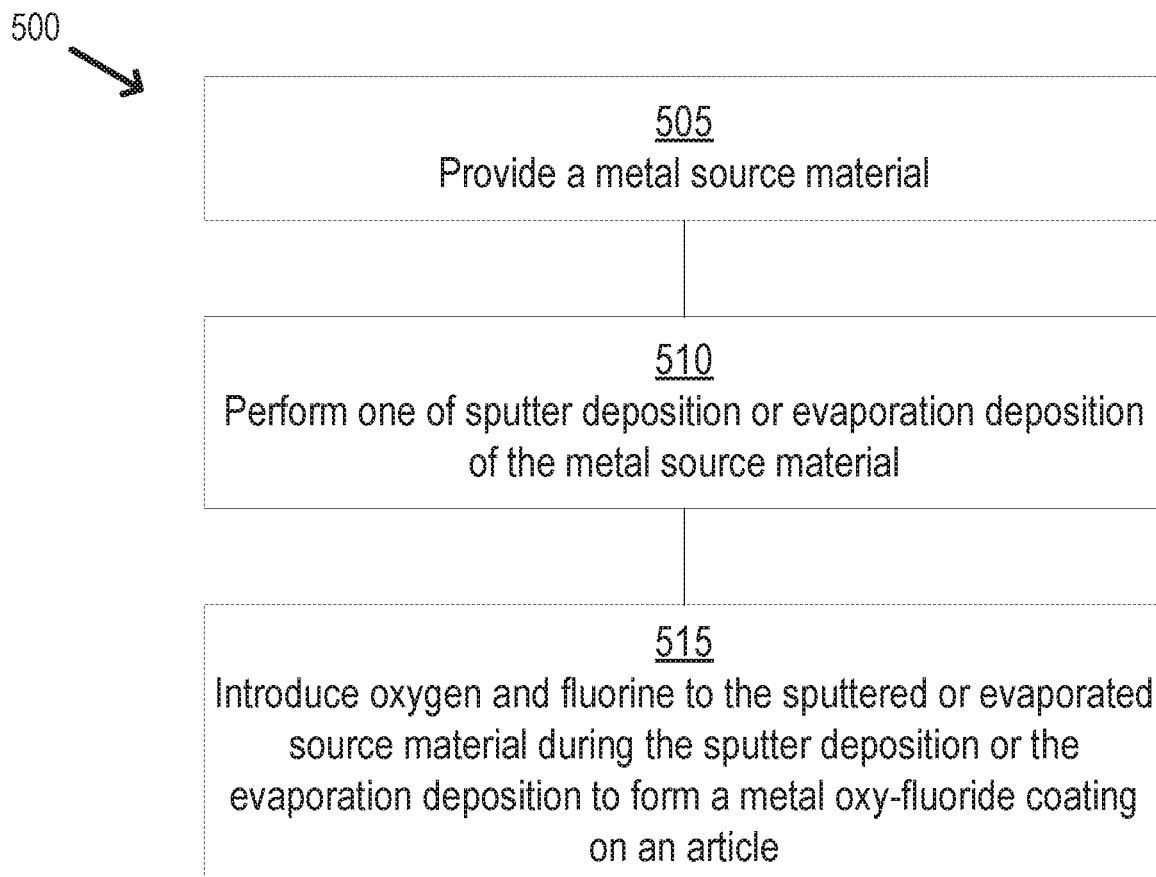

FIGS. 5A-C depict methods 500, 520, 540 for forming a MOF thin film protective coating. Generally, methods 500, 520, 540 involve providing a metal-containing source material and sputtering or evaporating the source material in the presence of reactive ions and radicals to form a MOF thin film protective coating on an article. Methods 500, 520, 540 may be performed in a vacuum chamber. In some embodiments, the vacuum chamber is pumped down to a fraction of a mTorr, and during deposition the chamber is maintained from 0.1 to 100 mTorr. Additionally, in some embodiments, the article is heated up to 15 to 150 degrees Celsius, and subsequently cooled after the MOF thin film protective coating is deposited.

FIG. 5A depicts method 500. At block 505, a metal source material is provided. The metal source material may be any metal suitable for forming the MOF thin film protective coating, as described above with regard to FIG. 1. For example, suitable metals include yttrium, gadolinium, aluminum, cerium, dysprosium, zirconium, calcium, magnesium, erbium, lanthanum, neodymium, ytterbium, and strontium, or alloys or combinations thereof. At block 510, the metal source material is sputtered or evaporated, such as could be accomplished by the apparatus depicted in FIG. 3B. At block 515, oxygen and fluorine ions or radicals are introduced to the sputtered or evaporated metal source material to form the MOF thin film protective coating on an article, such as a semiconductor process chamber component. In some embodiments, introducing the oxygen and fluorine ions or radicals further comprises bombarding the sputtered or evaporated metal with the oxygen and fluorine ions or radicals, such as by ion gun bombardment, or by forming a high-energy plasma adjacent to the surface of the article where the MOF thin film protective coating is being deposited. The resulting MOF thin film protective coating has an empirical formula $M_xO_{y\_coating}F_{z\_coating}$, where y_coating has a value of 0.1 to 1.9 times a value of x and z_coating has a value of 0.1 to 3.9 times the value of x. Additionally, the coating has a thickness of 1 to 30 microns and a porosity of less than 0.1%.

FIG. 5B depicts method 520. At block 525, a metal fluoride source material is provided having an empirical formula $M_xF_{z\_source}$. Z_source has a value of 0.1 to 4 times the value of x. The metal may be any metal as described with regard to method 500. In one embodiment, the source material is $YF_3$. At block 530, the metal fluoride source material is sputtered or evaporated, such as could be accomplished by the apparatus depicted in FIG. 3B. At block 535, oxygen ions or radicals are introduced to the sputtered or evaporated metal fluoride source material to form the MOF thin film protective coating on an article, such as a semiconductor process chamber component. In some embodiments, introducing the oxygen ions or radicals further comprises bombarding the sputtered or evaporated metal fluoride with the oxygen ions or radicals, such as by ion gun bombardment, or by forming a high-energy plasma adjacent to the surface of the article wherein the MOF thin film protective coating is being deposited. The resulting MOF thin film protective coating has an empirical formula $M_xO_{y\_coating}F_{z\_coating}$, where y_coating has a value of 0.1 to 1.9 times a value of x and z_coating has a value of 0.1 to 3.9 times the value of x. Additionally, the coating has a thickness of 1 to 30 microns and a porosity of less than 0.1%.

FIG. 5C depicts method 540. At block 545, a metal oxide source material is provided having an empirical formula $M_xO_{y\_source}$, where y_source has a value of 0.1 to 2 times the value of x. The metal may be any metal as described with regard to method 500. In one embodiment, the source material is $Y_2O_3$. At block 550, the metal oxide source material is sputtered or evaporated, such as could be accomplished by the apparatus depicted in FIG. 3B. At block 555, fluorine ions or radicals are introduced to the sputtered or evaporated metal fluoride source material to form the MOF thin film protective coating on an article, such as a semiconductor process chamber component. In some embodiments, introducing the fluorine ions or radicals further comprises bombarding the sputtered or evaporated metal oxide with the fluorine ions or radicals, such as by ion gun bombardment, or by forming a high-energy plasma adjacent to the surface of the article wherein the MOF thin film protective coating is being deposited. The resulting MOF thin film protective coating has an empirical formula $M_xO_{y\_coating}F_{z\_coating}$, where y_coating has a value of 0.1 to 1.9 times a value of x and z_coating has a value of 0.1 to 3.9 times the value of x. Additionally, the coating has a thickness of 1 to 30 microns and a porosity of less than 0.1%.

The preceding description sets forth numerous specific details such as examples of specific systems, components, methods, and so forth, in order to provide a good understanding of several embodiments of the present invention. It will be apparent to one skilled in the art that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should be determined with reference to the appended claims, along with the full scope of equivalents to which such claims are entitled.

What is claimed is:

1. A method of coating a chamber component for a plasma processing chamber, comprising:

providing a metal oxide source material consisting of a metal oxide having an empirical formula of $M_{x\_source}O_{y\_source}$, wherein $M_{x\_source}$ is a metal or a mixture of a plurality of metals selected from a group consisting of gadolinium, aluminum, cerium, dysprosium, zirconium, calcium, erbium, lanthanum, neodymium, ytterbium and strontium, and wherein y_source has a value of 0.1 to 2 times a value of x; and performing sputter deposition of the metal oxide source material to form a metal oxy-fluoride coating on the chamber component, wherein the chamber component is selected from a group consisting of a substrate support assembly, an electrostatic chuck, a ring, a chamber wall, a base, a gas distribution plate, a showerhead, a liner, a liner kit, a shield, a plasma screen, a flow equalizer, a cooling base, a chamber viewport, a chamber lid, a face plate and a selectivity modulation device, and wherein the chamber component comprises a material selected from a group consisting of a $Al_2O_3$, $Y_2O_3$, yttrium aluminum garnet, $Y_4Al_2O_9$, a solid-solution of $Y_2O_3$—$ZrO_2$, SiC, AlN, TiO, TiN and AlF, and wherein the chamber component does not comprise $SiO_2$ and a polymer;

wherein performing the sputter deposition comprises introducing at least one of fluorine ions or fluorine radicals to the sputtered metal oxide source material during the sputter deposition;

wherein the metal oxy-fluoride coating formed on the chamber component has an empirical formula of $M_{x\_coating}O_{y\_coating}F_{z\_coating}$, wherein $M_{x\_coating}$ is the metal or the mixture of the plurality of metals selected from the group consisting of gadolinium, aluminum, cerium, dysprosium, zirconium, calcium, erbium, lanthanum, neodymium, ytterbium and strontium;

wherein y_coating has a value of 0.1 to 1.9 times the value of x and z_coating has a value of 0.1 to 3.9 times the value of x;

wherein one of:
  a) $M_{x\_coating}$ has a valence of 2 and the metal oxy-fluoride coating comprises 37-48 at. % of the metal or the mixture of the plurality of metals, 10-43 at. % oxygen, and 10-53 at. % fluorine;
  b) $M_{x\_coating}$ has a valence of 3 and the metal oxy-fluoride coating comprises about 27-38 at. % of the metal, about 10-52 at. % oxygen, and about 10-63 at. % fluorine; or
  c) $M_{x\_coating}$ has a valence of 4 and the metal oxy-fluoride coating comprises about 22-32 at. % of the metal, about 10-58 at. % oxygen, and about 10-68 at. % fluorine; and wherein the metal oxy-fluoride coating has a thickness of 1 to 30 microns and a porosity of less than 0.1%.

2. The method of claim 1, further comprising heating the chamber component to 15 to 150 degrees Celsius.

3. The method of claim 1, wherein the sputter deposition is performed in a chamber having a pressure of 0.1 to 100 mTorr.

4. The method of claim 1, wherein the chamber component consists essentially of a material selected from a group consisting of $Al_2O_3$, $Y_2O_3$, yttrium aluminum garnet, $Y_4Al_2O_9$, a solid-solution of $Y_2O_3$—$ZrO_2$, SiC, AlN, TiO, TiN and AlF.

5. The method of claim 1, wherein the chamber component consists of $Al_2O_3$, $Y_2O_3$, yttrium aluminum garnet, $Y_4Al_2O_9$, a solid-solution of $Y_2O_3$—$ZrO_2$, SiC, AlN, TiO, TiN or AlF.

6. The method of claim 1, wherein $M_{x\_coating}$ has the valence of 2 and the metal oxy-fluoride coating comprises approximately 40-45 at. % of the metal or the mixture of the plurality of metals, approximately 20-35 at. % oxygen, and approximately 20-40 at. % fluorine.

7. The method of claim 1, wherein $M_{x\_coating}$ has the valence of 4 and the metal oxy-fluoride coating comprises approximately 26-28 at. % of the metal or the mixture of the plurality of metals, approximately 30-42 at. % oxygen, and approximately 30-44 at. % fluorine.

8. The method of claim 1, wherein y_coating has a value of 0.1 times the value of x.

9. The method of claim 1, wherein y_coating has a value of 1.4 to 1.9 times the value of x.

10. The method of claim 1, wherein $M_{x\_coating}$ has the valence of 3 and the metal oxy-fluoride coating comprises approximately 32-34 at. % of the metal or the mixture of the plurality of metals, approximately 30-36 at. % oxygen, and approximately 30-38 at. % fluorine.

11. The method of claim 1, wherein $M_{x\_coating}$ comprises at least two metals selected from the group consisting of gadolinium, aluminum, cerium, dysprosium, zirconium, calcium, erbium, lanthanum, neodymium, ytterbium and strontium.

12. The method of claim 1, wherein $M_{x\_coating}$ has the valence of 3.

13. The method of claim 1, wherein z_coating has a value of 0.1 to 0.2 times the value of x.

14. The method of claim 1, wherein z_coating has a value of 2.8 to 3.9 times the value of x.

15. The method of claim 1, wherein y_coating has a value of 0.1 times the value of x or 1.4 to 1.9 times a value of x and z_coating has a value of 0.1 to 0.2 times the value of x or 2.8 to 3.9 times the value of x.

16. The method of claim 1, wherein $M_{x\_coating}$ has the valence of 2.

17. The method of claim 1, wherein $M_{x\_coating}$ has the valence of 4.

* * * * *